United States Patent
Jeong et al.

(10) Patent No.: US 7,760,030 B2
(45) Date of Patent: Jul. 20, 2010

(54) PHASE DETECTION CIRCUIT AND METHOD THEREOF AND CLOCK RECOVERY CIRCUIT AND METHOD THEREOF

(75) Inventors: Dae-Seung Jeong, Seoul (KR); Ki-Mio Ueda, Seoul (KR); Duck Hyun Chang, Seongnam-si (KR); Hwa-Su Koh, Seongnam-si (KR); Young-Gyu Kang, Suwon-si (KR); Shu-Jiang Wang, Yongin-si (KR); Soon-Bok Jang, Suwon-si (KR); Nyun-Tae Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1398 days.

(21) Appl. No.: 11/185,825

(22) Filed: Jul. 21, 2005

(65) Prior Publication Data
US 2006/0018417 A1    Jan. 26, 2006

(30) Foreign Application Priority Data
Jul. 23, 2004    (KR) ................ 10-2004-0057642

(51) Int. Cl.
*H03L 7/00*    (2006.01)
(52) U.S. Cl. ........................... 331/25; 327/12

(58) Field of Classification Search ............. 327/12; 331/25
See application file for complete search history.

(56) References Cited

U.S. PATENT DOCUMENTS

| | | | |
|---|---|---|---|
| 5,301,196 A | 4/1994 | Ewen et al. | |
| 5,712,580 A | 1/1998 | Baumgartner et al. | |
| 6,177,812 B1 | 1/2001 | Nagao et al. | |
| 2002/0021470 A1* | 2/2002 | Savoj | 359/158 |
| 2002/0130692 A1 | 9/2002 | Hairapetian | |

FOREIGN PATENT DOCUMENTS

JP    09-162727    6/1997

* cited by examiner

*Primary Examiner*—Joseph Chang
(74) *Attorney, Agent, or Firm*—Harness, Dickey & Pierce, P.L.C.

(57) ABSTRACT

The phase detection circuit may allow an operating speed of a semiconductor circuit to be increased irrespective of whether a combinational logic circuit within the semiconductor circuit operates at lower operating speeds. The phase detection circuit may adjust a data rate of an input data signal and selectively enable reference signals and error signals. The phase detection circuit may be included within a clock data recovery circuit.

30 Claims, 7 Drawing Sheets

XOR

MUX

PHASE DETECTION CIRCUIT AND METHOD THEREOF AND CLOCK RECOVERY CIRCUIT AND METHOD THEREOF

CLAIM FOR PRIORITY

This application claims priority under 35 USC §119 to Korean Patent Application No. 2004-57642, filed on Jul. 23, 2004, the contents of which are herein incorporated by reference in their entirety.

BACKGROUND OF THE INVENTION

1. Field of the Invention

The present invention relates generally to semiconductor devices and methods thereof, and more particularly to a phase detection circuit and method thereof and a clock recovery circuit and method thereof.

2. Description of the Related Art

A clock data recovery (CDR) circuit may be used in a receiver of a data transmission system operating at higher speeds (e.g., an optical communication system, a backplane routing system, a chip-to-chip interconnection system, etc.) to provide a clock signal for recovering a digital signal. The CDR circuit may be classified into one of two types of CDR depending on whether the CDR circuit receives a reference clock signal from an external crystal oscillator to provide the clock signal.

In a first type of CDR, if the reference clock signal is received from the external crystal oscillator, an external clock and a clock divider may generate a clock signal having a frequency substantially the same as a frequency of a bit rate of input data.

In a second type of CDR, if the reference clock signal is not received from the external crystal oscillator, a frequency detector may extract frequency information from the input data.

In another example, a half-rate CDR having a bit rate equal to half of a bit rate of the input data may be used to transmit data at higher data rates. If the half-rate CDR is used, a pair of phase-locked loops (PLLs) may generate a half-rate quadrature clock. Alternatively, a single PLL may generate the half-rate quadrature clock. If the pair of PLLs is used, a chip area and/or a power consumption of the half-rate CDR may be higher. If the single PLL is used, a voltage controlled oscillator (VCO) may generate a higher frequency corresponding to the higher data transmission rate and quadrature clocks may be transmitted on a receiving channel at higher frequencies.

As the data rate of the CDR increases, using the single PLL may increase a difficulty in designing a complementary metal oxide semiconductor (CMOS) of a PLL/VCO with lower jitter characteristics. Further, during transmission of the clock signal from the CDR to respective channels, a mismatching and/or a coupling effect among transmission lines may be increased proportional to the frequency of the quadrature clock and a power consumption of a transmission buffer.

Further, an operating speed and/or a data rate of the CDR may be based on a phase detector (PD). The PD may operate at higher speeds in order to detect a phase difference between the input data and the clock signal. The phase detector may include a nonlinear PD and a linear PD. The nonlinear PD may detect whether the phase of the clock signal may trail (e.g., be behind) or follow (e.g., be ahead) relative to the phase of the input data. In an example, a CDR may include a quarter-rate binary phase detector and may operate at a data rate of 40 Gbits/sec.

The linear PD may detect a phase error of the clock signal based on the input data. In an example, a CMOS CDR may include a half-rate linear PD and may operate at a data rate of 40 Gbits/s. Relative to the nonlinear PD, the linear PD may cause a lower amount of charge pump activity, a lower ripple on a control voltage of the VCO, and thereby a lower amount of jitter.

The phase detector may include a differential exclusive logic circuit to detect an error signal corresponding to a phase difference between the input data and the clock signal. The detected error signal may have a pulse width narrower than a unit interval (UI).

As the data rate of the input signal applied to the phase detector using the differential exclusive logic circuit increases (e.g., up to 10 Gb/s), a pulse width of the error signal may be decreased (e.g., from 100 picoseconds (ps) to several picoseconds) such that the differential exclusive logic circuit may not detect the error signal. Thus, an operation speed of the differential exclusive logic circuit may act as a "bottleneck" which may limit an operation speed or data rate of the CDR.

SUMMARY OF THE INVENTION

An example embodiment of the present invention is directed to a phase detection circuit, including a first storing unit generating a plurality of first stored data signals based on an input data signal, a second storing unit generating a plurality of second stored data signals based on the plurality of first stored data signals, an error signal detection unit generating a plurality of relaxed error signals based on at least one of the plurality of first stored data signals, a reference signal detection unit generating a plurality of relaxed reference signals based on at least one of the plurality of second stored data signals, a first switching unit generating a plurality of error signals based on the plurality of relaxed error signals and a plurality of clock signals and a second switching unit generating a plurality of reference signals based on the plurality of relaxed reference signals and the plurality of clock signals.

Another example embodiment of the present invention is directed to a method of detecting a phase, including receiving a first data signal at a first data rate, splitting the received first data signal into a plurality of second data signals, each of the plurality of second data signals including a portion of the first data signal and having a second data rate lower than the first data rate and selectively enabling at least one signal associated with the first data signal based on the plurality of second data signals and at least one clock signal.

Another example embodiment of the present invention is directed to a clock data recovery circuit, including a voltage controlled oscillator configured to generate a plurality of clock signals based on a control voltage signal, a phase detector circuit configured to adjust a data rate of a data signal and to generate a plurality of error signals and a plurality of reference signals, pulse widths of the plurality of error signals and the plurality of reference signals being wider than a unit interval, a charge pump configured to generate a phase detection signal and a filter configured to provide the control voltage signal to the voltage controlled oscillator.

Another example embodiment of the present invention is directed to a method of recovering a clock data, including generating a plurality of clock signals based on a control voltage signal, adjusting a data rate of a data signal using the plurality of clock signals, a plurality of error signals and a plurality of reference signals, pulse widths of the plurality of error signals and the plurality of reference signals being wider than a unit interval, generating a phase detection signal based on a phase difference between the data signal and the plurality of clock signals, the plurality of error signals and the plurality of reference signals and filtering the phase detection signal to provide the control voltage signal.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of example embodiments of the present invention.

DESCRIPTION OF EXAMPLE EMBODIMENTS OF THE PRESENT INVENTION

Figure 1:
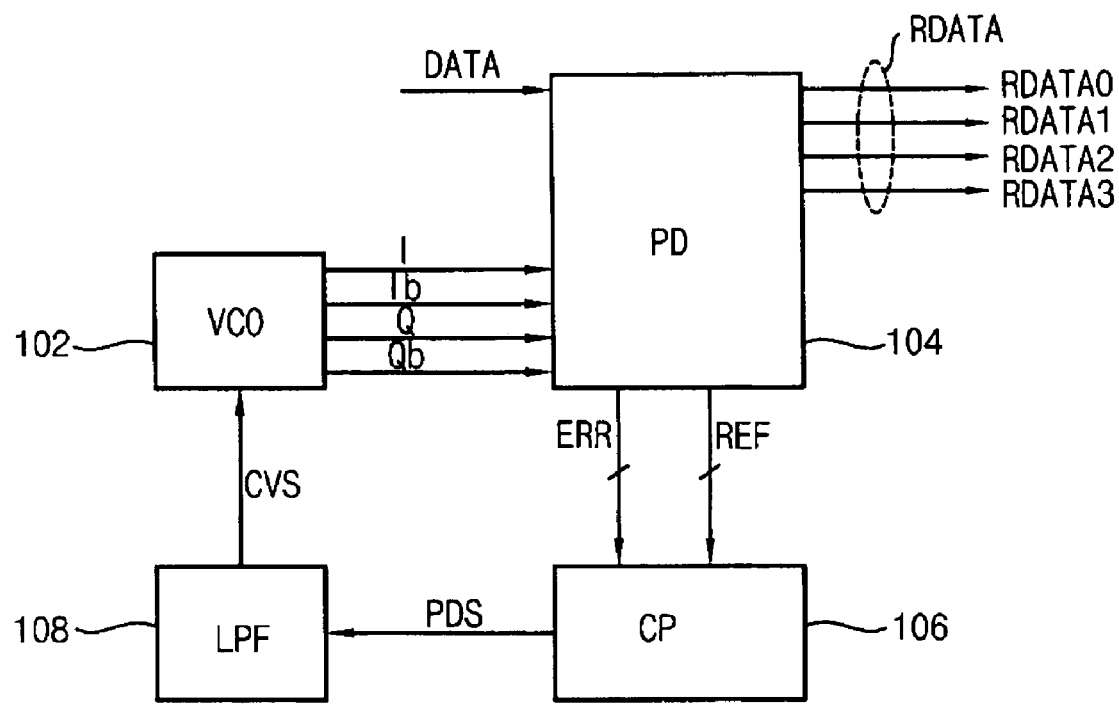
FIG. 1 is a block diagram illustrating a clock data recovery (CDR) circuit according to an example embodiment of the present invention.

Hereinafter, example embodiments of the present invention will be described in detail with reference to the accompanying drawings.

In the Figures, the same reference numerals are used to denote the same elements throughout the drawings.

FIG. 1 is a block diagram illustrating a clock data recovery (CDR) circuit 100 according to an example embodiment of the present invention.

In the example embodiment of FIG. 1, the CDR circuit 100 may include a voltage controlled oscillator 102, a quarter-rate linear phase detector 104, a charge pump 106 and a filter 108.

In the example embodiment of FIG. 1, the voltage controlled oscillator 102 may generate first through fourth clock signals I, Q, Ib, Qb having a given frequency (e.g., 2.5 GHz) based on a control voltage signal CVS. The voltage controlled oscillator 102 may include a ring oscillator (not shown) for generating the first through fourth clock signals I, Q, Ib, Qb. The first clock signal I may have a first phase (e.g., 0°), the second clock signal Q may have a second phase (e.g., 90°), the third clock signal Ib may have a third phase (e.g., 180°) and the fourth clock signal Qb may have a fourth phase (e.g., 270°).

In the example embodiment of FIG. 1, the ring oscillator (not shown) of the voltage controlled oscillator 102 may include two differential delay cells (not shown) coupled in a loop and two differential output buffers (not shown) for buffering an output of the respective delay cells. A first of the two differential buffers may output the first and third clock signals I and Ib, respectively, and a second of the two differential buffers may output the second and fourth clock signals Q and Qb, respectively. In an example, a bias current of the differential output buffers may be adjusted such that a clock signal (e.g., one of the first through fourth clock signals I, Q, Ib and Qb) may follow the phase of input data based on the control voltage signal CVS. Thus, the clock signal may be adjusted or recovered to follow the phase of the input data.

In the example embodiment of FIG. 1, the quarter-rate linear phase detector 104 may adjust or retime a data signal DATA having a frequency of a first frequency (e.g., 10 GHz) based on the first through fourth clock signals I, Q, Ib, Qb at a second frequency (e.g., 2.5 GHz) and may perform a demultiplexing (e.g., a 4:1 demultiplexing operation) on the data signal DATA to output data RDATA0/RDATA1/RDATA2/RDATA3 at a first data rate (e.g., 2.5 Gbits/s).

In the example embodiment of FIG. 1, the quarter-rate linear phase detector 104 may output a plurality of error signals ERR and a plurality of reference signals REF with a pulse width wider than a unit interval (UI). Hereinafter, the UI may be referred to as a unit pulse width of the data signal DATA. In an example, if the data signal DATA has a first data rate (e.g., 10 Gbps), the unit interval may have a first duration (e.g., 100 picoseconds). In another example, if the data signal DATA has a second data rate (e.g., 40 Gbps), the unit interval may have a second duration (e.g., 25 ps). Thus, the data rate of the data signal DATA and the unit interval may be inversely related.

In the example embodiment of FIG. 1, the charge pump 106 may receive the plurality of the error signals ERR and the reference signals REF and may output a phase detection signal PDS based on a phase difference between the data signal DATA and the first through fourth clock signals I, Q, Ib and Qb.

In the example embodiment of FIG. 1, the filter 108 (e.g., a loop filter) may filter a lower frequency component of the phase detection signal PDS to reduce (e.g., remove) a ripple in the phase detection signal PDS to output the control voltage signal CVS. A voltage level of the control voltage signal CVS may thereby be based on the phase difference between the data signal DATA and the first through fourth clock signals I, Q, Ib and Qb.

Figure 2:
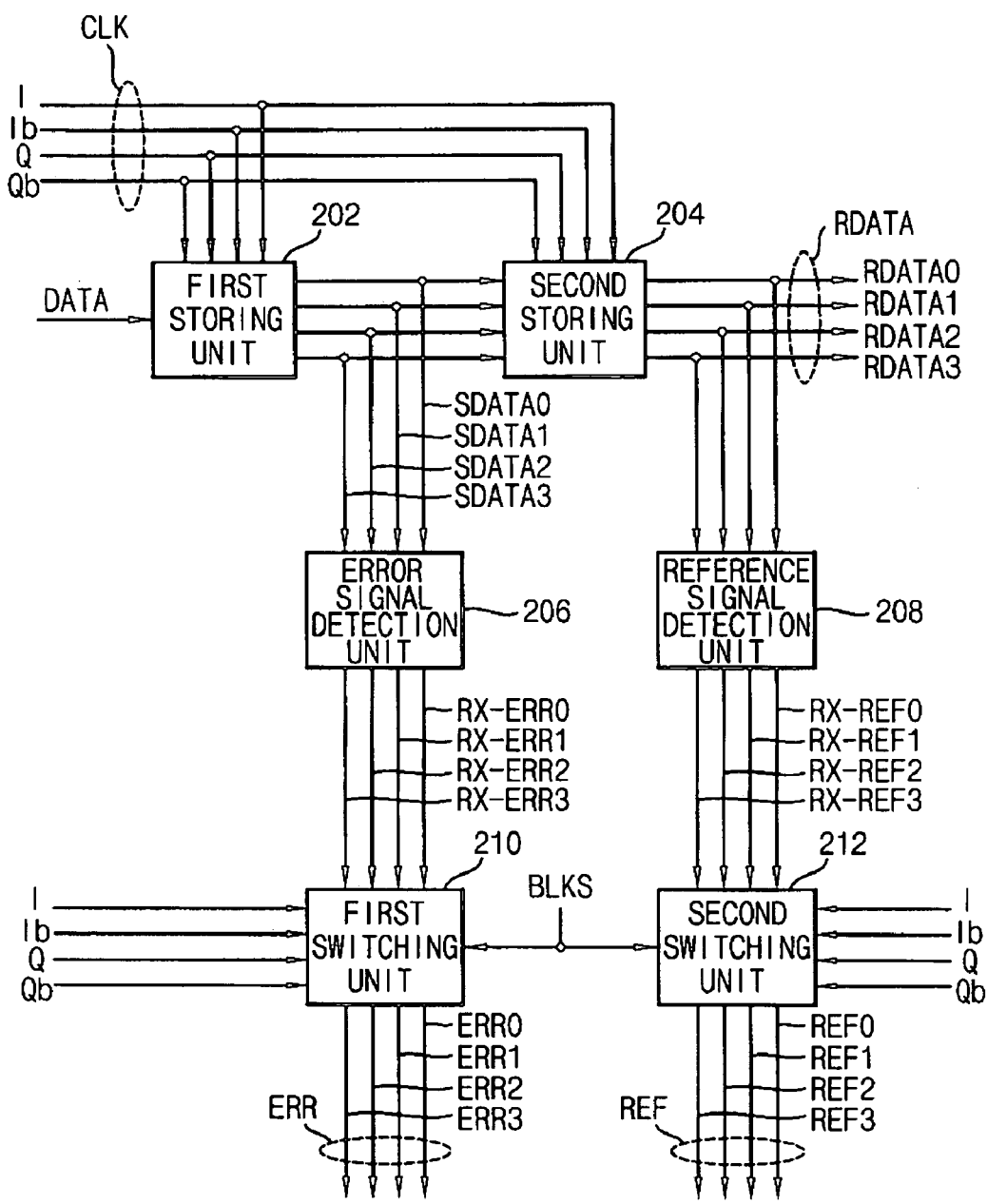
FIG. 2 is a block diagram illustrating the quarter-rate linear phase detector of FIG. 1 according to another example embodiment of the present invention.

FIG. 2 is a block diagram illustrating the quarter-rate linear phase detector 104 of FIG. 1 according to another example embodiment of the present invention.

In the example embodiment of FIG. 2, the quarter-rate linear phase detector 104 may include a first storing unit 202, a second storing unit 204, an error signal detection unit 206, a reference signal detection unit 208, a first switching unit 210 and a second switching unit 212.

In the example embodiment of FIG. 2, the first storing unit 202 may pass the data signal DATA at the first data rate (e.g., 10 Gbps) when a clock signal CLK corresponding to each of the first through fourth clock signals I, Q, Ib and Qb may be set to a first logic level (e.g., a higher logic level, a lower logic level, etc.) and may generate first stored data signals SDATA0, SDATA1, SDATA2 and SDATA3 when the clock signal CLK may be set to the second logic level (e.g., a lower logic level, a higher logic level, etc.).

In the example embodiment of FIG. 2, the second storing unit 204 may pass the first stored data signals SDATA0 to SDATA3 when the clock signal CLK corresponding to each of the first through fourth clock signals I, Q, Ib and Qb may be set to the first logic level and generate quarter-rate recovered data signals RDATA0, RDATA1, RDATA21 and RDATA3 based on the first stored data signals SDATA0 to SDATA3, respectively.

Figure 3:
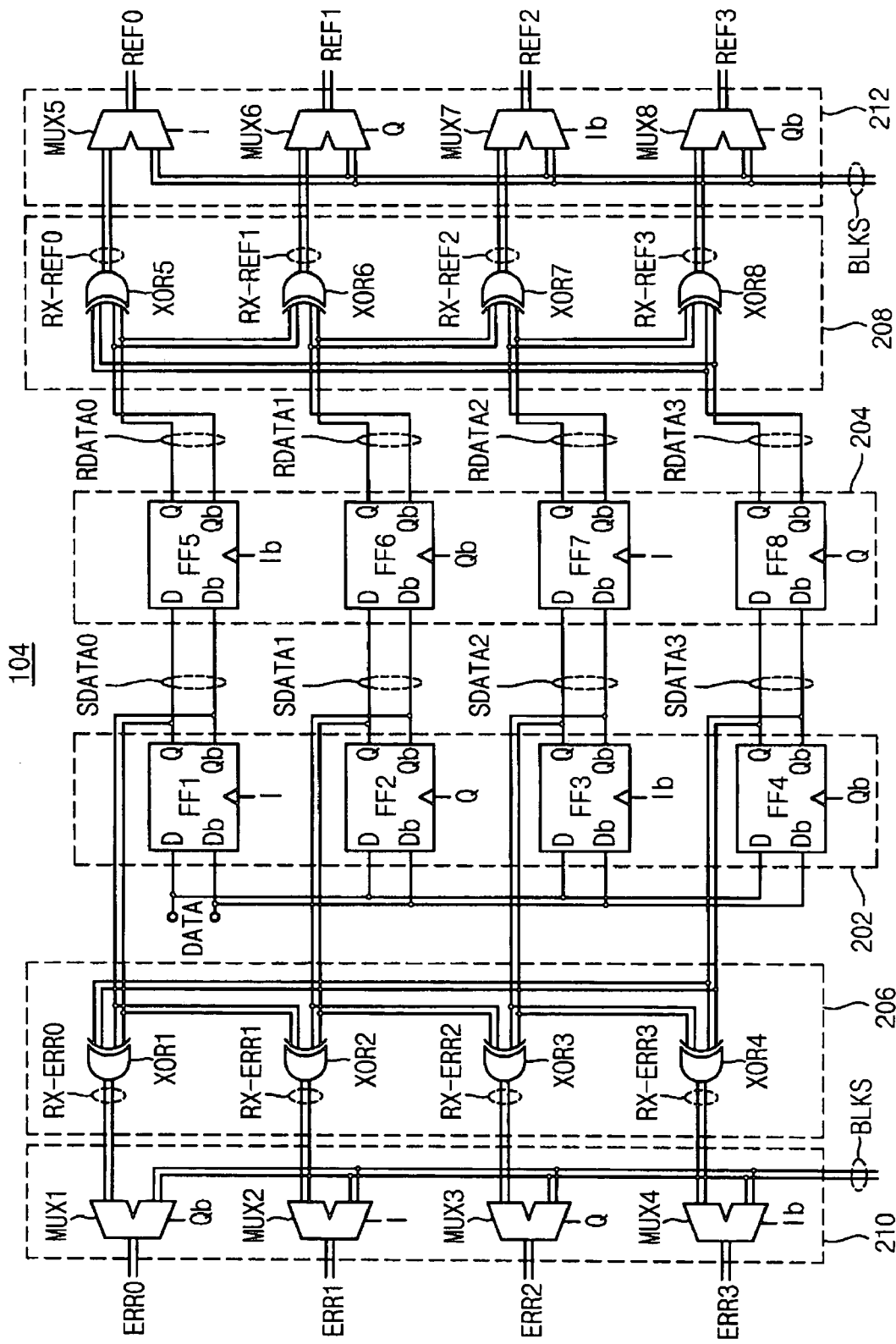
FIG. 3 is a circuit diagram illustrating the quarter-rate linear phase detector of FIGS. 1 and 2 according to another example embodiment of the present invention.

FIG. 3 is a circuit diagram illustrating the quarter-rate linear phase detector 104 of FIGS. 1 and 2 according to another example embodiment of the present invention.

In the example embodiment of FIG. 3, the first storing unit 202 may include D flip-flops FF1, FF2, FF3 and FF4. A differential input data signal DATA may be received by a differential input terminal of each of the D flip-flops FF1 to FF4.

In the example embodiment of FIG. 3, the D flip-flop FF1 may pass the differential input data signal DATA when the first clock signal I may be set to the first logic level (e.g., a higher logic level) and may hold the differential input data signal DATA to generate the first stored data signal SDATA0 when the first clock signal I transitions to the second logic level (e.g., a lower logic level).

In the example embodiment of FIG. 3, the D flip-flop FF2 may pass the differential input data signal DATA when the second clock signal Q may be set to the first logic level (e.g., a higher logic level) and may hold the differential input data signal DATA to generate the first stored data signal SDATA1 when the second clock signal Q transitions to the second logic level (e.g., a lower logic level).

In the example embodiment of FIG. 3, the D flip-flop FF3 may pass the differential input data signal DATA when the third clock signal Ib may be set to the first logic level (e.g., a higher logic level) and may hold the differential input data signal DATA to generate the first stored data signal SDATA2 when the second clock signal I transitions to the second logic level (e.g., a lower logic level).

In the example embodiment of FIG. 3, the D flip-flop FF4 may pass the differential input data signal DATA when the fourth clock signal Qb may be set to the first logic level (e.g., a higher logic level) and may hold the differential input data signal DATA to generate the first stored data signal SDATA3 when the fourth clock signal Qb transitions to the second logic level (e.g., a lower logic level).

In the example embodiment of FIG. 3, the second storing unit 204 may include D flip-flops FF5 to FF8. The first stored data signals SDATA0 to SDATA3 may be applied to a differential input terminal of each of the D flip-flops FF1 to FF4, respectively.

In the example embodiment of FIG. 3, the D flip-flop FF5 may pass the first stored data signal SDATA0 when the third clock signal Ib may be set to the first logic level (e.g., a higher logic level) and may hold the first stored data signal SDATA0 to generate the recovered data signal RDATA0 when the third clock signal Ib transitions to the second logic level (e.g., a lower logic level).

In the example embodiment of FIG. 3, the D flip-flop FF6 may pass the first stored data signal SDATA1 when the fourth clock signal Qb may be set to the first logic level (e.g., a higher logic level) and may hold the first stored data signal SDATA1 to generate the recovered data signal RDATA1 when the second clock signal Q transitions to the second logic level (e.g., a lower logic level).

In the example embodiment of FIG. 3, the D flip-flop FF7 may pass the first stored data signal SDATA2 when the first clock signal I may be set to the first logic level (e.g., a higher logic level) and may hold the first stored data signal SDATA2 to generate the recovered data signal RDATA2 when the third clock signal Ib transitions to the second logic level (e.g., a lower logic level).

In the example embodiment of FIG. 3, the D flip-flop FF8 may pass the first stored data signal SDATA3 when the second clock signal Q may be set to the first logic level (e.g., a higher logic level) and may hold the first stored data signal SDATA3 to generate the recovered data signal RDATA3 when the second clock signal Q transitions to the second logic level (e.g., a lower logic level).

Figure 9:
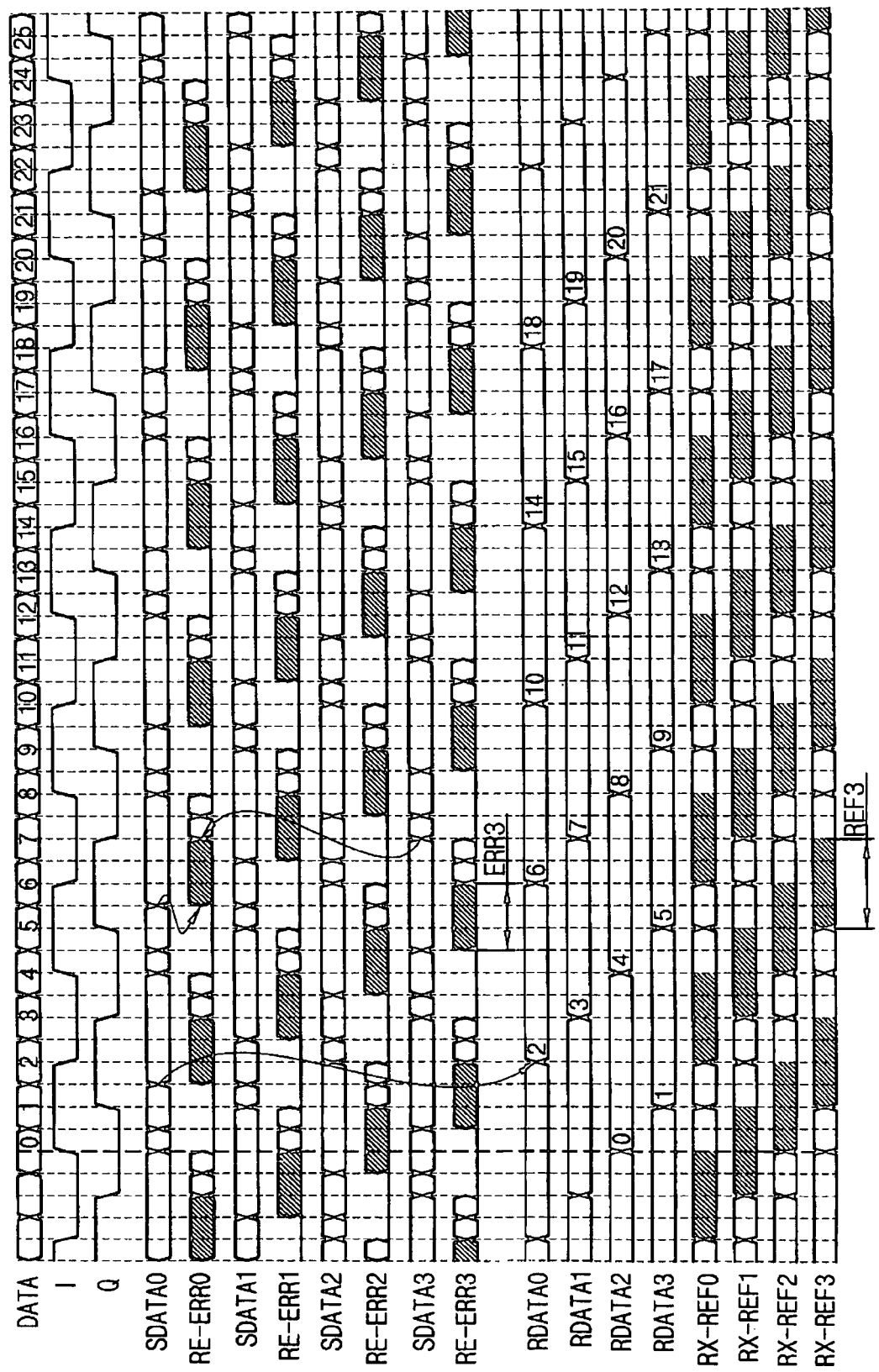
FIG. 9 is a waveform timing diagram illustrating a phase detection performed by the CDR circuit of FIG. 1 according to another example embodiment of the present invention.

In the example embodiment of FIG. 3, the recovered data signal RDATA2 may be demultiplexed to first bits (e.g., zeroth, fourth, eighth, etc. bits) of the data signal DATA (e.g., the first stored data signal SDATA2) that may be first stored in the D flip-flop FF3 in response to a first edge (e.g., a falling edge) of the third clock signal Ib and may be maintained by the D flip-flop FF7 in response to the first edge (e.g., a falling edge) of the first clock signal I, as will be described later in greater detail with reference to FIG. 9. The recovered data signal RDATA3 may be demultiplexed to second bits (e.g., first, fifth, ninth, etc. bits) of the data signal DATA (e.g., the first stored data signal SDATA3) that may be first stored in the D flip-flop FF4 in response to the first edge (e.g., a falling edge) of the fourth clock signal Qb and may be maintained by the D flip-flop FF8 in response to the first edge (e.g., a falling edge) of the second clock signal Q, as will be described later in greater detail with reference to FIG. 9.

In the example embodiment of FIG. 3, the recovered data signal RDATA0 may be demultiplexed to third bits (e.g., second, sixth, tenth, etc. bits) of the data signal DATA (e.g., the first stored data signal SDATA0) that may be first stored in the D flip-flop FF 1 in response to the first edge (e.g., the falling edge) of the first clock signal I and may be maintained by the D flip-flop FF5 in response to the first edge (e.g., the falling edge) of the third clock signal Ib, as will be described later in greater detail with reference to FIG. 9. The recovered data signal RDATA1 may be demultiplexed to fourth bits (e.g., third, seventh, eleventh, etc. bits) of the data signal DATA (e.g., the first stored data signal SDATA1) that may be first stored in the D flip-flop FF2 in response to the first edge (e.g., the falling edge) of the second clock signal Q and may be maintained by the D flip-flop FF6 in response to the first edge (e.g., the falling edge) of the fourth clock signal Qb, as will be described later in greater detail with reference to FIG. 9.

Figure 4:
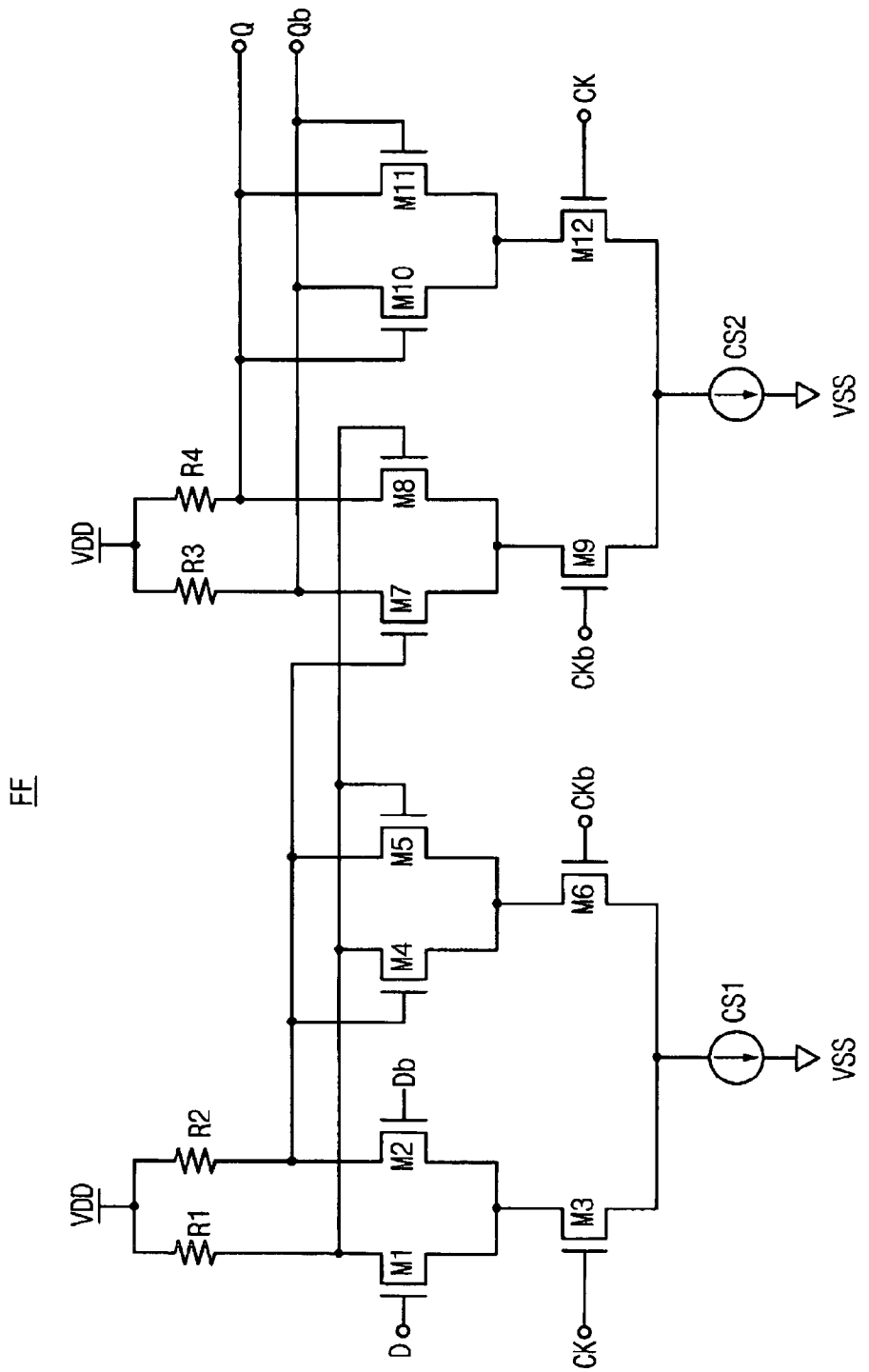
FIG. 4 illustrates a D flip-flop according to another example embodiment of the present invention.

FIG. 4 illustrates a D flip-flop FF according to another example embodiment of the present invention.

In the example embodiment of FIG. 4, the D flip-flop FF may be representative of one of the D flip-flops FF1 to FF8 as described above with respect to FIG. 3. In an example, the D flip-flop FF may be implemented using a current-controlled CMOS (C3MOS) logic circuit.

In the example embodiment of FIG. 4, the D flip-flop FF may include first through fourth resistors R1, R2, R3 and R4, first through twelfth MOS transistors M1 to M12, clock signal inputs CK and CKb, data inputs D and Db, current sources CS1 and CS2, voltages VDD and VSS and outputs Q and Qb.

In the example embodiment of FIG. 3, the error signal detection unit 206 may perform a logical exclusive OR operation on any pair of the first stored data signals SDATA0 to SDATA3 (e.g., SDATA3 and SDATA0, SDATA0 and SDATA1, SDATA1 and SDATA2, SDATA2 and SDATA3, etc.) to generate relaxed error signals RX-ERR0, RX-ERR1, RX-ERR2 and RX-ERR3. In an example, the relaxed error signals RX-ERR0 to RX-ERR3 may correspond to an error signal having a pulse width wider than the unit interval.

In the example embodiment of FIG. 3, the reference signal detection unit 208 may perform a logical exclusive OR operation on any pair of the recovered data signals RDATA0 to RDATA3 (e.g., RDATA3 and RDATA0, RDATA0 and RDATA1, RDATA1 and RDATA2, RDATA2 and RDATA3, etc.) to generate relaxed reference signals RX-REF0, RX- REF1, RX-REF2 and RX-REF3. In an example, the relaxed reference signals RX-REF0 to RX-REF3 may correspond to a reference signal having a pulse width wider than the unit interval.

In the example embodiment of FIG. 3, the error signal detection unit 206 may include XOR gates XOR1, XOR2, XOR3 and XOR4. The XOR gate XOR1 may perform a logical XOR of the first stored data signals SDATA3 and SDATA0 to generate the relaxed error signal RX-ERR0. The XOR gate XOR2 may perform a logical XOR of the first stored data signals SDATA0 and SDATA1 to generate the relaxed error signal RX-ERR1. The XOR gate XOR3 may performs a logical XOR of the first stored data signals SDATA1 and SDATA2 to generate the relaxed error signal RX-ERR2. The XOR gate XOR3 may perform a logical XOR of the first stored data signals SDATA2 and SDATA3 to generate the relaxed error signal RX-ERR3.

In the example embodiment of FIG. 3, the reference signal detection unit 208 may include XOR gates XOR5, XOR6, XOR7 and XOR8. The XOR gate XOR5 may perform a logical XOR of the recovered data signals RDATA3 and RDATA0 to generate the relaxed reference signal RX-REF0. The XOR gate XOR6 may perform a logical XOR of the recovered data signals RDATA0 and RDATA1 to generate the relaxed reference signal RX-REF1. The XOR gate XOR7 may perform a logical XOR of the recovered data signals RDATA1 and RDATA2 to generate the relaxed reference signal RX-REF2. The XOR gate XOR8 may perform a logical XOR of the recovered data signals RDATA2 and RDATA3 to generate the relaxed reference signal RX-REF3.

Figure 5:
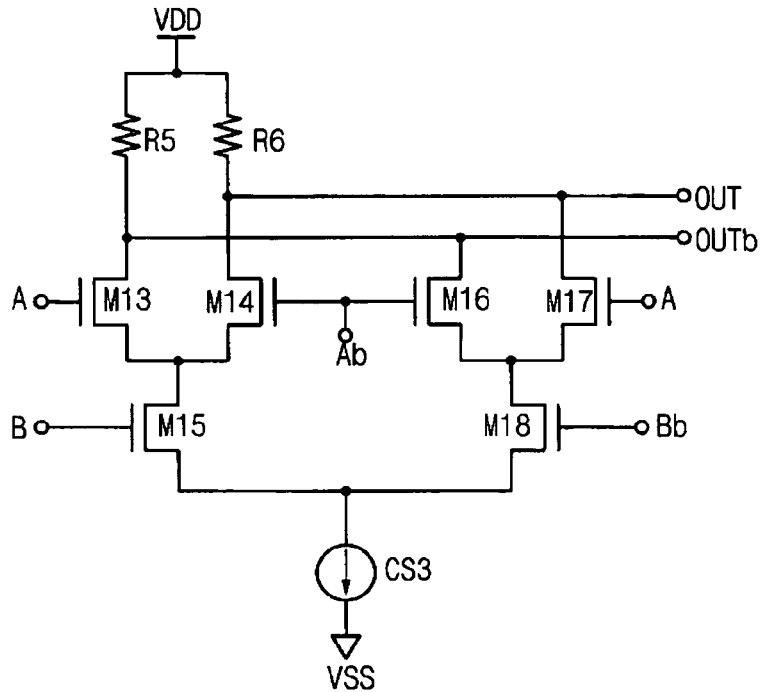
FIG. 5 illustrates an XOR gate according to another example embodiment of the present invention.

FIG. 5 illustrates an XOR gate according to another example embodiment of the present invention.

In the example embodiment of FIG. 5, the XOR gate may be representative of one of the XOR gates XOR1 to XOR8 as described above with respect to FIG. 3. In an example, the XOR gate may be implemented using a C3MOS logic circuit.

In the example embodiment of FIG. 5, the XOR gate may include resistors R5 and R6, MOS transistors M13 to M18, voltages VDD and VSS, data inputs A, B, Ab and Bb, current source CS3, voltages VDD and VSS and outputs OUT and OUTb.

In the example embodiment of FIG. 3, the first switching unit 210 may select at least one of the relaxed error signals RX-ERR0 to RX-ERR3 based on a corresponding clock signal (e.g., at least one of the first through fourth clock signals I, Q, Ib and Qb) having the first logic level (e.g., a higher logic level). The first switching unit 210 may select a blocking signal BLKS based on a corresponding clock signal (e.g., at least one of the first through fourth clock signals I, Q, Ib and Qb) having the second logic level (e.g., a lower logic level) to generate error signals ERR0 to ERR3.

In the example embodiment of FIG. 3, the second switching unit 212 may select at least one the relaxed reference signals RX-REF0 to RX-REF3 as reference signals REF0, REF1, REF2 and REF3, respectively, if a corresponding clock signal (e.g., at least one of the first through fourth clock signals I, Q, Ib and Qb) is set to the first logic level (e.g., a higher logic level). The second switching unit 212 may select a blocking signal BLKS as the reference signals REF0, REF1, REF2 and REF3, respectively, if a corresponding clock signal (e.g., at least one of the first through fourth clock signals I, Q, Ib and Qb) is set to the second logic level (e.g., a lower logic level).

In the example embodiment of FIG. 3, the first and second switching units 210 and 212 may include multiplexers MUX1 to MUX4 and MUX5 to MUX8, respectively.

In the example embodiment of FIG. 3, the multiplexer MUX1 may select the relaxed error signal RX-ERR0 as the error signal ERR0 if the fourth clock signal Qb is set to the first logic level (e.g., a higher logic level). Alternatively, the multiplexer MUX1 may select the blocking signal BLKS as the error signal ERR0 if the fourth clock signal Qb is set to the second logic level (e.g., a lower logic level).

In the example embodiment of FIG. 3, the multiplexer MUX2 may select the relaxed error signal RX-ERR1 as the error signal ERR1 if the first clock signal I is set to the first logic level (e.g., a higher logic level). Alternatively, the multiplexer MUX2 may select the blocking signal BLKS as the error signal ERR1 if the first clock signal I is set to the second logic level (e.g., a lower logic level).

In the example embodiment of FIG. 3, the multiplexer MUX3 may select the relaxed error signal RX-ERR2 as the error signal ERR2 if the second clock signal Q is set to the first logic level (e.g., a higher logic level). Alternatively, the multiplexer MUX3 may select the blocking signal BLKS as the error signal ERR2 if the second clock signal Q is set to the second logic level (e.g., a lower logic level).

In the example embodiment of FIG. 3, the multiplexer MUX4 may select the relaxed error signal RX-ERR3 as the error signal ERR3 if the third clock signal Ib is set to the first logic level (e.g., a higher logic level). Alternatively, the multiplexer MUX4 may select the blocking signal BLKS as the error signal ERR3 if the third clock signal Ib is set to the second logic level (e.g., a lower logic level).

In the example embodiment of FIG. 3, the multiplexer MUX5 may select the relaxed reference signal RX-REF0 as the reference signal REF0 if the first clock signal I is set to the first logic level (e.g., a higher logic level). Alternatively, the multiplexer MUX5 may select the blocking signal BLKS as the reference signal REF0 if the first clock signal Qb is set to the second logic level (e.g., a lower logic level).

In the example embodiment of FIG. 3, the multiplexer MUX6 may select the relaxed reference signal RX-ERR1 as the reference signal REF1 if the second clock signal Q is set to the first logic level (e.g., a higher logic level). Alternatively, the multiplexer MUX6 may select the blocking signal BLKS as the reference signal REF1 if the second clock signal Q is set to the second logic level (e.g., a lower logic level).

In the example embodiment of FIG. 3, the multiplexer MUX7 may select the relaxed reference signal RX-ERR2 as the reference signal REF2 if the third clock signal Ib is set to the first logic level (e.g., a higher logic level). Alternatively, the multiplexer MUX7 may select the blocking signal BLKS as the reference signal REF2 if the third clock signal Ib is set to the second logic level (e.g., a lower logic level).

In the example embodiment of FIG. 3, the multiplexer MUX8 may select the relaxed reference signal RX-ERR3 as the reference signal REF32 if the fourth clock signal Qb is set to the first logic level (e.g., a higher logic level). Alternatively, the multiplexer MUX8 may select the blocking signal BLKS as the reference signal REF3 if the fourth clock signal Qb is set to the second logic level (e.g., a lower logic level).

Figure 6:
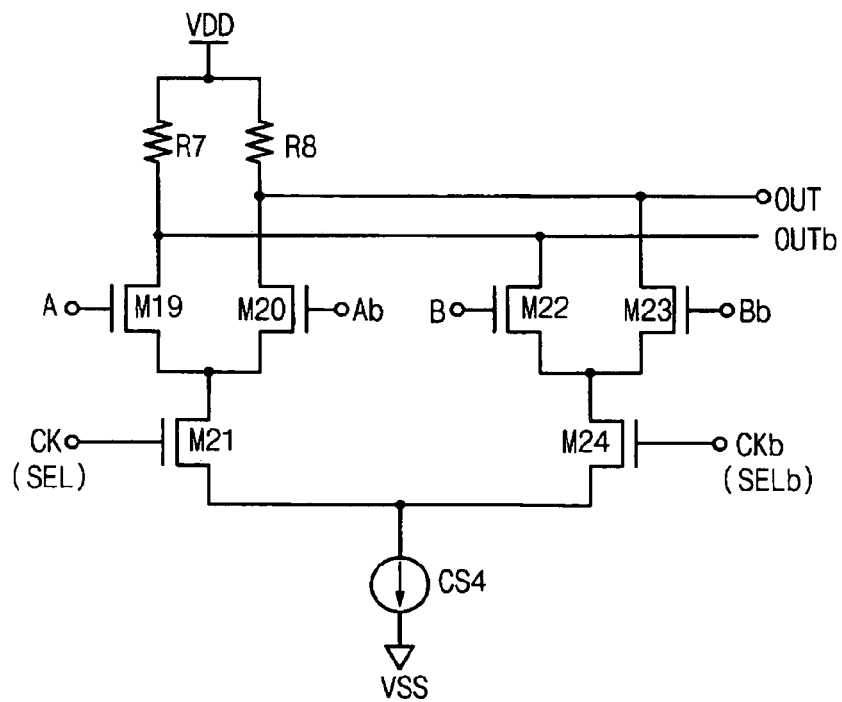
FIG. 6 illustrates a multiplexer according to another example embodiment of the present invention.

FIG. 6 illustrates a multiplexer MUX according to another example embodiment of the present invention.

In the example embodiment of FIG. 6, the multiplexer MUX may be representative of at least one of the multiplexers MUX1 to MUX8 of FIG. 3. The multiplexer MUX may include resistors R7 and R8, MOS transistors M19 to M24, data inputs A, Ab, B and Bb, selection signals CK and CKb and outputs OUT and OUTh. In an example, the multiplexer MUX may be a C3MOS logic circuit.

Figure 7:
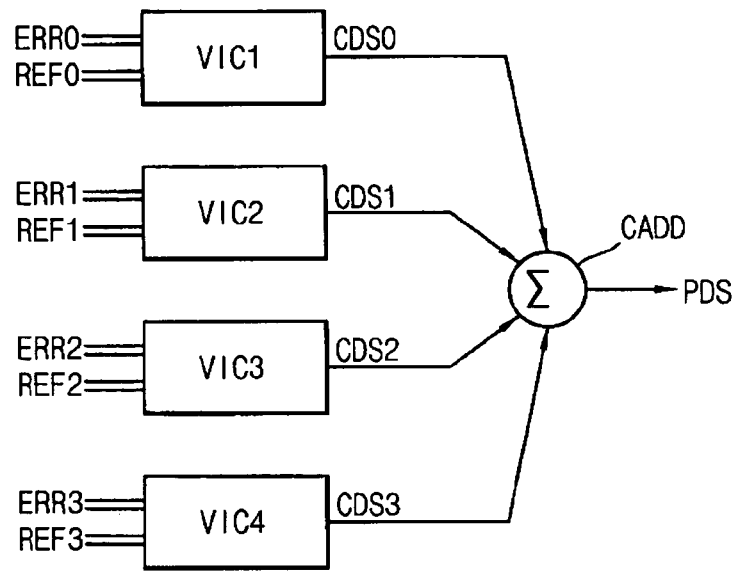
FIG. 7 is a block diagram illustrating the charge pump of FIG. 1 according to another example embodiment of the present invention.

FIG. 7 is a block diagram illustrating the charge pump (CP) 106 of FIG. 1 according to another example embodiment of the present invention.

In the example embodiment of FIG. 7, the charge pump 106 may include voltage-to-current converters VIC1, VIC2, VIC3 and VIC4. The voltage-to-current converters VIC1 to VIC4 may receive the error signals ERR0 to ERR3, respectively, and the reference signals REF0 to REF3, respectively. The voltage-to-current converters VIC1 to VIC4 may generate current signals CDS0, CDS1, CDS2 and CDS3, respectively, based on the received error signals ERR0 to ERR3, respectively, and the reference signals REF0 to REF3, respectively. The charge pump 106 may further include a current adder CADD. The current adder CADD may sum or combine the received currents signals CDS0 to CDS3 to output the phase detection signal PDS.

Figure 8:
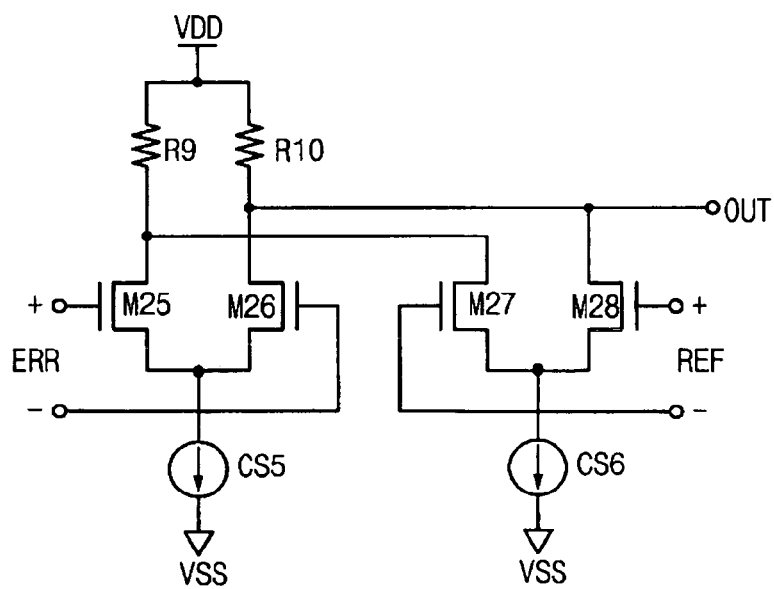
FIG. 8 illustrates a voltage-to-current converter according to another example embodiment of the present invention.

FIG. 8 illustrates a voltage-to-current converter VIC according to another example embodiment of the present invention.

In the example embodiment of FIG. 8, the voltage-to-current converter VIC may be representative of at least one of the voltage-to-current converters VIC1 to VIC4 of FIG. 7. The voltage-to-current converter VIC may include resistors R9 and R10, MOS transistors M25, M26, M27 and M28, inputs ERR (e.g., ERR0, ERR1, etc.) and REF (e.g., REF0, REF1, etc.), current sources CS5 and CS6, voltage sources VDD and VSS and an output OUT. In an example, the voltage-to-current converter VIC may be a C3MOS logic circuit.

FIG. 9 is a waveform timing diagram illustrating a phase detection performed by the CDR circuit 100 of FIG. 1 according to another example embodiment of the present invention.

In the example embodiment of FIG. 9, the data signal DATA may be output as the stored data signals SDATA0 to SDATA3 from the first storing unit 202 based on the clock signals I, Q, Ib and Qb. Flip-flops FF1 to FF4 of the first storing unit 202 may output the input data signal DATA as the stored data signals SDATA0 to SDATA3 when a corresponding clock signal (e.g., first clock signal I, second clock signal Q, etc.) is set to the first logic level (e.g., a higher logic level) and may hold the data signal DATA when the corresponding clock signal may transition to the second logic level (e.g., a lower logic level) in response to the first edge (e.g., a falling edge) of the corresponding clock signal.

In the example embodiment of FIG. 9, the stored data signals SDATA0 to SDATA3 may receive a corresponding input data signal DATA when the clock signal corresponding to each of the clock signals I, Q, Ib and Qb is set to the first logic level (e.g., a higher logic level). Alternatively, when the corresponding clock signal is set to the second logic level (e.g., a lower logic level), the stored data signals SDATA0 to SDATA3 may maintain the corresponding input data signal DATA in response to the first edge (e.g., falling edge) of the corresponding clock signal.

In the example embodiment of FIG. 9, the relaxed error signals RX-ERR0 to RX-ERR3 may include error information and may be obtained by performing a logical XOR of a pair of the stored data signals SDATA0 to SDATA3. Since the logic XOR operation may be performed on pairs of the stored data signals SDATA0 to SDATA3 having a pulse width wider than the unit interval, the relaxed error signals RX-ERR0 to RX-ERR3 may be obtained at a higher level of accuracy irrespective of an operating speed of the XOR gate. Therefore, the error signals ERR0 to ERR3 may have a pulse width including a phase difference between the input data signal DATA and the clock signal CLK that may be wider than the unit interval.

In the example embodiment of FIG. 9, the recovered data signals RDATA0 to RDATA3 may be output from the second storing unit 204 based on the stored data signals SDATA0 to SDATA3 and the clock signals I, Q, Ib and Qb. Flip-flops FF5 to FF8 of the second storing unit 204 may output the stored data signals SDATA0 to SDATA3 (e.g., data signals DATA maintained by the first storing unit 202) and may hold the stored data signals SDATA0 to SDATA3 in response to the first edge (e.g., a falling edge) of the corresponding clock signal such that the data signal DATA may be demultiplexed. In an example, the demultiplexed data signal having a pulse width corresponding to four unit intervals may be combined using the XOR gates XOR5 to XOR8 of the reference signal detection unit 208 such that the relaxed reference signals may be output at a higher level of accuracy.

In the example embodiment of FIG. 9, undesired signal intervals may be disabled in the relaxed error signals RX-ERR0 to RX-ERR3 by the first switching unit 210 using the blocking signal BLKS to selectively output desired signal intervals. A resultant error signal (e.g., the enabled portions of the desired signal intervals) may be provided to the charge pump 106. Likewise, undesired signal intervals among the relaxed reference signals RX-REF0 to RX-REF3 may be disabled by the second switching unit 212 using the blocking signal BLKS to selectively output desired signal intervals. A resultant reference signal (e.g., the enabled portions of the desired signal intervals) may be received by the charge pump 106.

In another example embodiment of the present invention, a full-rate data signal may be reduced to a lower rate (e.g., a quadrature or quartered rate) using clock signals (e.g., quadrature clock signals). An XOR operation may be performed on the clock signals such that the full-rate data may be recovered from the lower-rate data. In an example, the lower-rate may enable a CDR circuit to operate at higher full-rate frequencies because an operating speed may not be bottle-necked (e.g., by an operating speed limit of an XOR gate). Thus, higher data rates may be employed by circuits according to example embodiments of the present invention. In an example, if there is a 4:1 ratio between a full-rate to a reduced rate (e.g., a quarter reduction) and XOR gates in the CDR circuit 100 are limited to 10 GHz, the data rate may 40 GHz (e.g., higher than the operating speed limit of the XOR gates). Thus, an operating speed of combinational logic gates (e.g., XOR gates) need not be limiting to an operating speed of a circuit including the combinational logic gates (e.g., the CDR circuit 100).

Example embodiments of the present invention being thus described, it will be obvious that the same may be varied in many ways. For example, while above-described example embodiments of the present invention are directed to increasing a data rate of a semiconductor circuit up to four times, it is understood that other example embodiments of the present invention may adjust the data rate according to any desired proportion. For example, the ratio between a full-rate and a reduce-rate may be 8:1 in another example circuit. In this example, the example circuit may include eight clock signals and an increased number of XOR gates. Other adjustments necessary to accommodate a circuit for the increased data rate will be readily understood by one skilled in the art. Further, it is understood that above-described frequencies (e.g., 2.5 GHz, 10 GHz, etc.) are given as examples only, and other example embodiments of the present invention may include circuitry configured to operate at other frequencies.

Further, while the first edge is above-described as a falling edge, it is understood that other example embodiments of the present invention may use a second edge (e.g., a rising edge) as a trigger for the above-described operations associated with the first edge.

Further, it is understood that the above-described first and second logic levels/states may correspond to a higher level (e.g., a logic "1") and a lower logic level (e.g., a logic "0"), respectively, in an example embodiment of the present invention. Alternatively, the first and second logic levels/states may correspond to the lower logic level and the higher logic level, respectively, in other example embodiments of the present invention.

Such variations are not to be regarded as departure from the spirit and scope of example embodiments of the present invention, and all such modifications as would be obvious to one skilled in the art are intended to be included within the scope of the following claims.

What is claimed is:

1. A phase detection circuit, comprising:
   a first storing unit generating a plurality of first stored data signals based on an input data signal;
   a second storing unit generating a plurality of second stored data signals based on the plurality of first stored data signals;
   an error signal detection unit generating a plurality of relaxed error signals based on at least one of the plurality of first stored data signals;
   a reference signal detection unit generating a plurality of relaxed reference signals based on at least one of the plurality of second stored data signals;
   a first switching unit generating a plurality of error signals based on the plurality of relaxed error signals and a plurality of clock signals; and
   a second switching unit generating a plurality of reference signals based on the plurality of relaxed reference signals and the plurality of clock signals.

2. The phase detection circuit of claim 1, wherein the first storing unit generates the plurality of first stored data signals by outputting the input data signal if a corresponding one of the plurality of clock signals is at a first logic level and maintaining the input data signal if the corresponding one of the plurality of clock signals is at a second logic level.

3. The phase detection circuit of claim 1, wherein the second storing unit generates the plurality of second stored data signals by outputting the at least one of the plurality of first stored data signals if a corresponding at least one of the plurality of clock signals is at a first logic level and maintaining the at least one of the plurality of first stored data signals if the corresponding at least one of the plurality of clock signals is at a second logic level.

4. The phase detection circuit of claim 1, wherein the error signal detection unit generates the plurality of relaxed error signals by performing an XOR operation on at least two of the plurality of first stored data signals.

5. The phase detection circuit of claim 1, wherein the reference signal detection unit generates the plurality of relaxed reference signals by performing an XOR operation on at least two of the plurality of second stored data signals.

6. The phase detection circuit of claim 1, wherein the first switching unit generates the plurality of error signals by selectively enabling at least one of the plurality of relaxed error signals if a corresponding one of the plurality of clock signals is at a first logic level and selectively disabling the at least one of the plurality of relaxed error signals if the corresponding one of the plurality of clock signals is at a second logic level.

7. The phase detection circuit of claim 1, wherein the second switching unit generates the plurality of reference signals by selectively enabling at least one of the plurality of relaxed reference signals if a corresponding one of the plurality of clock signals is at a first logic level and selectively disabling the at least one of the plurality of relaxed error signals if the corresponding one of the plurality of clock signals is at a second logic level.

8. The phase detection circuit of claim 1, wherein pulse widths of the plurality of relaxed error signals and the plurality of relaxed reference signals are wider than a unit interval.

9. The phase detection circuit of claim 1, wherein the plurality of clock signals includes four clock signals having phases of about 0°, about 90°, about 180° and about 270°, respectively.

10. The phase detection circuit of claim 1, wherein the data signal, the first and second stored data signals, the error signal and the reference signal have a differential signal, respectively.

11. The phase detection circuit of claim 1, wherein each of the first and second storing units includes at least one D flip-flop, a number of the at least one D flip-flop in each of the first and second storing units corresponding to a number of the plurality of clock signals.

12. The phase detection circuit of claim 1, wherein each of the error signal detection unit and the reference signal detection unit includes at least one XOR gate, a number of the at lest one XOR gate in each of the error signal detection unit and the reference signal detection unit corresponding to a number of the plurality of clock signals.

13. The phase detection circuit of claim 1, wherein each of the first and second switching units includes at least one multiplexer, a number of the at least one multiplexer corresponding to a number of the plurality of clock signals.

14. The phase detection circuit of claim 1, wherein the at least one multiplexer includes a 2:1 multiplexer.

15. The phase detection circuit of claim 1, wherein the second storing unit generates the plurality of second stored data signals by demultiplexing the input data signal based on at least one of the plurality of clock signals.

16. The phase detection circuit of claim 1, wherein the plurality of first stored data signals includes first through fourth first stored data signals, the plurality of second stored data signals include first through fourth second stored data signals, the plurality of relaxed error signals includes first through fourth relaxed error signals, the plurality of relaxed reference signals includes first through fourth reference signals, the plurality of error signals includes first through fourth error signals, the plurality of reference signals includes first through fourth reference signals and the plurality of clock signals includes first through fourth clock signals.

17. The phase detection circuit of claim 16, wherein the first storing unit includes:
   a first D flip-flop configured to pass the input data signal in response to the first clock signal having a first logic level and configured to hold the input data signal in response to the first clock signal having a second logic level to generate the first first stored data signal;
   a second D flip-flop configured to pass the input data signal in response to the second clock signal having the first logic level and configured to hold the input data signal in response to the second clock signal having the second logic level to generate the second first stored data signal;
   a third D flip-flop configured to pass the input data signal in response to the third clock signal having the first logic level and configured to hold the input data signal in response to the third clock signal having the second logic level to generate the third first stored data signal; and a fourth D flip-flop configured to pass the input data signal in response to the fourth clock signal having the first logic level and configured to hold the input data signal in response to the fourth clock signal having the second logic level to generate the fourth first stored data signal.

18. The phase detection circuit of claim 17, wherein the second storing unit includes:
a fifth D flip-flop configured to pass the first first stored data signal in response to the third clock signal having the first logic level and configured to hold the first first stored data signal in response to the third clock signal having the second logic level to generate the first second stored data signal;
a sixth D flip-flop configured to pass the second first stored data signal in response to the fourth clock signal having the first logic level and configured to hold the second first stored data signal in response to the fourth clock signal having the second logic level to generate the second second stored data signal;
a seventh D flip-flop configured to pass the third stored data signal in response to the first clock signal having the first logic level and configured to hold the third data signal in response to the first clock signal having the second logic level to generate the third second stored data signal; and
an eighth D flip-flop configured to pass the fourth stored data signal in response to the second clock signal having the first logic level and configured to hold the fourth stored data signal in response to the second clock signal having the second logic level to generate the fourth second stored data signal.

19. The phase detection circuit of claim 16, wherein the error signal detection unit includes:
a first XOR gate configured to perform a first XOR operation on the first first stored data signal and the fourth first stored data signal to generate the first relaxed error signal;
a second XOR gate configured to perform a second XOR operation on the first first stored data signal and the second first stored data signal to generate the second relaxed error signal;
a third XOR gate configured to perform a third XOR operation on the second first stored data signal and the third first stored data signal to generate the third relaxed error signal; and
a fourth XOR gate configured to perform a fourth XOR operation on the third first stored data signal and the fourth first stored data signal to generate the fourth relaxed error signal.

20. The phase detection circuit of claim 19, wherein the reference signal detection unit includes:
a fifth XOR gate configured to perform a fifth XOR operation on the fourth second stored data signal and the first second stored data signal to generate the first relaxed reference signal;
a sixth XOR gate configured to perform a sixth XOR operation on the first second stored data signal and the second second stored data signal to generate the second relaxed reference signal;
a seventh XOR gate configured to perform a seventh XOR operation on the second second stored data signal and the third second stored data signal to generate the third relaxed reference signal; and
an eighth XOR gate configured to perform an eighth XOR operation on the third second stored data signal and the fourth second stored data signal to generate the fourth relaxed reference signal.

21. The phase detection circuit of claim 16, wherein the first switching unit includes:
a first multiplexer configured to select the first relaxed error signal in response to the fourth clock signal having a first logic level and configured to select a blocking signal in response to the fourth clock signal having a second logic level to generate the first error signal;
a second multiplexer configured to select the second relaxed error signal in response to the first clock signal having the first logic level and configured to select the blocking signal in response to the first clock signal having the second logic level to generate the second error signal;
a third multiplexer configured to select the third relaxed error signal in response to the second clock signal having the first logic level and configured to select the blocking signal in response to the second clock signal having the second logic level to generate the third error signal; and
a fourth multiplexer configured to select the fourth relaxed error signal in response to the third clock signal having the first logic level and configured to select the blocking signal in response to the third clock signal having the second logic level to generate the fourth error signal.

22. The phase detection circuit of claim 21, wherein the second switching unit includes:
a fifth multiplexer configured to select the first relaxed reference signal in response to the first clock signal having the first logic level and configured to select the blocking signal in response to the first clock signal having the second logic level to generate the first reference signal;
a sixth multiplexer configured to select the second relaxed reference signal in response to the second clock signal having the first logic level and configured to select the blocking signal in response to the second clock signal having the second logic level to generate the second reference signal;
a seventh multiplexer configured to select the third relaxed reference signal in response to the third clock signal having the first logic level and configured to select the blocking signal in response to the third clock signal having the second logic level to generate the third reference signal; and
an eighth multiplexer configured to select the fourth relaxed reference signal in response to the fourth clock signal having the first logic level and configured to select the blocking signal in response to the fourth clock signal having the second logic level to generate the fourth reference signal.

23. The phase detection circuit of claim 1, further comprising:
a current-to-voltage conversion unit configured to convert pairs of the plurality of error signal and the plurality of reference signals into a plurality of current signals; and
a current adder configured to combine the plurality of current signals to output a phase detection signal.

24. The phase detection circuit of claim 16, further comprising:
a current-to-voltage conversion unit configured to convert pairs of the plurality of error signal and the plurality of reference signals into a plurality of current signals; and
a current adder configured to combine the plurality of current signals to output a phase detection signal.

25. The phase detection circuit of claim 24, wherein the current-to-voltage conversion unit includes:

a first current-to-voltage converter configured to convert a first pair including the first error signal and the first reference signal into a first current signal;

a second current-to-voltage converter configured to convert a second pair including the second error signal and the second reference signal into a second current signal;

a third current-to-voltage converter configured to convert a third pair including the third error signal and the third reference signal into a third current signal; and a fourth current-to-voltage converter configured to convert a fourth pair including the fourth error signal and the fourth reference signal into a fourth current signal.

26. A method of detecting a phase, comprising:

receiving a first data signal at a first data rate;

splitting the received first data signal into a plurality of second data signals, each of the plurality of second data signals including a portion of the first data signal and having a second data rate lower than the first data rate; and selectively enabling at least one signal associated with the first data signal based on the plurality of second data signals and at least one clock signal, wherein the at least one signal includes a plurality of relaxed reference signals and a plurality of relaxed error signals.

27. The method of claim 26, wherein the plurality of relaxed reference signals are included in a combined reference signal and the plurality of relaxed error signals are included in a combined error signal.

28. The method of claim 26, wherein pulse widths of the at least one signal are wider than a unit interval.

29. The method of claim 26, wherein the at least one clock signal has a phase corresponding to one of about 0°, about 90°, about 180° and about 270°.

30. A phase detection circuit for performing the method of claim 26.

* * * * *